United States Patent
Dickel et al.

(10) Patent No.: US 8,325,953 B2
(45) Date of Patent: Dec. 4, 2012

(54) HEARING APPARATUS CHIP WITH A SEPARATE EMC GROUND AND CORRESPONDING HEARING APPARATUS

(75) Inventors: Thomas Dickel, Buttenheim (DE); Georg Gottschalk, Erlangen (DE); Thomas Kasztelan, Bestensee (DE)

(73) Assignee: Siemens Medical Instruments Pte. Ltd., Singapore (SG)

( * ) Notice: Subject to any disclaimer, the term of this patent is extended or adjusted under 35 U.S.C. 154(b) by 1057 days.

(21) Appl. No.: 12/291,687

(22) Filed: Nov. 12, 2008

(65) Prior Publication Data
US 2009/0123008 A1 May 14, 2009

(30) Foreign Application Priority Data

Nov. 13, 2007 (DE) .......................... 10 2007 054 030

(51) Int. Cl.
*H04R 25/00* (2006.01)
(52) U.S. Cl. .......................... 381/312; 323/312; 343/850
(58) Field of Classification Search .................. 381/312; 323/312; 343/850
See application file for complete search history.

(56) References Cited

U.S. PATENT DOCUMENTS

| 5,194,932 | A | 3/1993 | Kurisu |
| 5,781,074 | A * | 7/1998 | Nguyen et al. ................ 331/105 |
| 5,841,202 | A | 11/1998 | Noguchi et al. |
| 5,914,526 | A | 6/1999 | Iwata |
| 2005/0280405 | A1 * | 12/2005 | Bray ............................. 323/312 |

FOREIGN PATENT DOCUMENTS

| DE | 19651554 A1 | 6/1997 |
| DE | 196 02 453 C1 | 7/1997 |
| DE | 197 20 681 A1 | 11/1997 |

* cited by examiner

*Primary Examiner* — Kenneth Parker
*Assistant Examiner* — Dale E Page

(57) ABSTRACT

A Hearing apparatuses and a hearing apparatus chip are provided. A hearing apparatus chip for processing a signal of a hearing apparatus includes a signal-processing component and a first ground wire connected to a first terminal of the component. The signal processing component includes a second ground wire galvanically separated from the first ground wire on the chip and is connected to a second terminal of the component by way of a capacitor, in order to conduct interference signals as a result of electromagnetic couplings. In particular, the sensitive ground of a preamplifier is not then interfered with by leakage currents.

12 Claims, 2 Drawing Sheets

HEARING APPARATUS CHIP WITH A SEPARATE EMC GROUND AND CORRESPONDING HEARING APPARATUS

CROSS REFERENCE TO RELATED APPLICATIONS

This application claims priority of German application No. 10 2007 054 030.4 DE filed Nov. 13, 2007, which is incorporated by reference herein in its entirety.

FIELD OF INVENTION

The present invention relates to a hearing apparatus chip for processing a signal of a hearing apparatus having at least one signal-processing component and an earth wire, which is connected to a terminal of the at least one component. The present invention also relates to a hearing apparatus with a corresponding hearing apparatus chip. The term "hearing apparatus" is understood here to mean any sound-emitting device which can be worn on or in the ear, in particular a hearing device, a headset, earphones and suchlike.

BACKGROUND OF INVENTION

Hearing devices are wearable hearing apparatuses which are used to assist the hard-of-hearing. In order to accommodate numerous individual requirements, various types of hearing devices are available such as behind-the-ear (BTE) hearing devices, hearing device with external receiver (RIC: receiver in the canal) and in-the-ear (ITE) hearing devices, for example also concha hearing devices or completely-in-the-canal (ITE, CIC) hearing devices. The hearing devices listed as examples are worn on the outer ear or in the auditory canal. Bone conduction hearing aids, implantable or vibrotactile hearing aids are also available on the market. The damaged hearing is thus stimulated either mechanically or electrically.

The key components of hearing devices are principally an input converter, an amplifier and an output converter. The input converter is normally a receiving transducer e.g. a microphone and/or an electromagnetic receiver, e.g. an induction coil. The output converter is most frequently realized as an electroacoustic converter e.g. a miniature loudspeaker, or as an electromechanical converter e.g. a bone conduction hearing aid. The amplifier is usually integrated into a signal processing unit. This basic configuration is illustrated in FIG. 1 using the example of a behind-the-ear hearing device. One or a plurality of microphones 2 for recording ambient sound are built into a hearing device housing 1 to be worn behind the ear. A signal processing unit 3 which is also integrated into the hearing device housing 1 processes and amplifies the microphone signals. The output signal for the signal processing unit 3 is transmitted to a loudspeaker or receiver 4, which outputs an acoustic signal. Sound is transmitted through a sound tube, which is affixed in the auditory canal by means of an otoplastic, to the device wearer's eardrum. Power for the hearing device and in particular for the signal processing unit 3 is supplied by means of a battery 5 which is also integrated in the hearing device housing 1.

SUMMARY OF INVENTION

Very minimal currents are processed in hearing devices, as a result of which the sensitivity to external interferences is also relatively high. In particular, electromagnetic radiation, which acts from the outside, may negatively affect the signal processing of a hearing device. A typical example of this is the situation in which a hearing device wearer uses a mobile telephone. The data is namely generally transmitted from a mobile telephone or to a mobile telephone in data packets, the packet frequency of which lies in the audible range. It is thus necessary to configure the electromagnetic compatibility (EMC) of a hearing device to be correspondingly high and to take suitable measures in respect hereof.

Previously shieldings were used to keep electromagnetic radiation away from the hearing device signal processing. Alternatively or in addition, all components, which are to conduct currents produced by electromagnetic interferences, are connected to the earth. The sensitive preamplifier is however usually also connected to the earth. The small voltage fluctuations produced in the earth by leakage currents then clearly affect the output signal of the preamplifier.

The object of the present invention thus consists in reducing the sensitivity of hearing apparatuses to electromagnetic radiation.

This object is achieved in accordance with the invention by a hearing apparatus chip for processing a signal of a hearing apparatus having at least one signal-processing component and a first earth wire, which is connected to a first terminal of the at least one component, as well as a second earth wire, which is galvanically separated from the first earth wire on the chip and is connected to a second terminal of the at least one component by way of a capacitor, in order to conduct interference signals as a result of electromagnetic couplings.

EMC interference signals can advantageously be conducted by the separate second earth wire, which represents an independent EMC earth, without the functional earth of certain components of the hearing apparatus being negatively affected as a result.

The signal-processing component is preferably a preamplifier, the signal input of which corresponds to the second terminal. The EMC interferences conducted by way of the additional EMC earth therefore do not act on the sensitive input of the preamplifier.

The second earth wire can be realized as a separate metal layer or at least as a separate partial layer within the chip, i.e. the integrated circuit. A very wide-area conduction is thus provided, which not only achieves a large shielding effect but can also be easily reached from different points on the chip.

Alternatively, the second earth wire can however also be realized as a line embedded in the chip substrate. This may be necessary for production or space-saving reasons if no complete metal layer can be provided for the EMC earth.

The first and second earth wires each have their own connecting pin. The EMC earth, i.e. the second earth wire, is thus also particularly easily accessible from the outside.

According to one preferred embodiment, a hearing apparatus and in particular a hearing device is provided with an electrical voltage source and a hearing apparatus chip as described above. The first earth wire and second earth wire are each connected here to an earth terminal of the current source by way of a connecting wire and only meet directly at the earth terminal. This results in the leakage currents not flowing across significant passages in the functional earth, i.e. the first earth wire, and not negatively affecting the components of the chip, but also other components in the hearing apparatus.

BRIEF DESCRIPTION OF THE DRAWINGS

The present invention is described in more detail with reference to the appended drawings, in which.

DETAILED DESCRIPTION OF INVENTION

The exemplary embodiments illustrated in more detail below represent preferred embodiments of the present invention.

Figure 1:
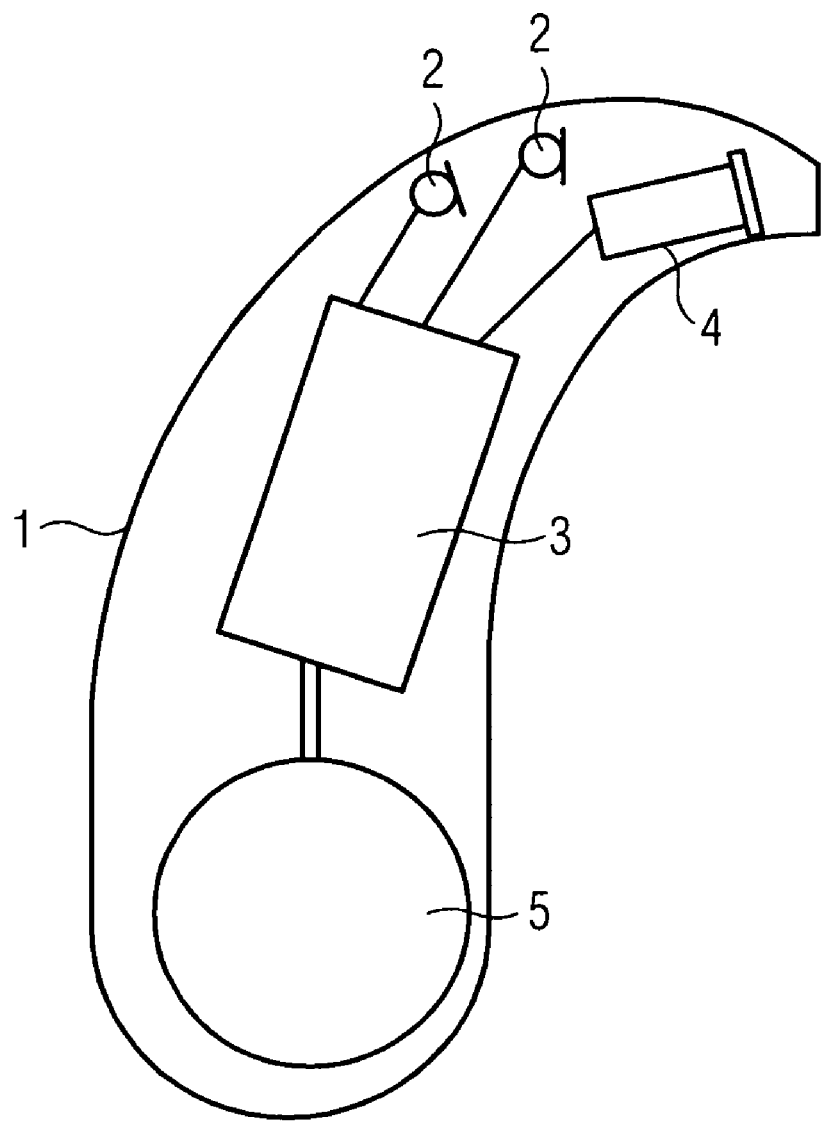
FIG. 1 shows the main design of a hearing apparatus according to the prior art.
Figure 2:
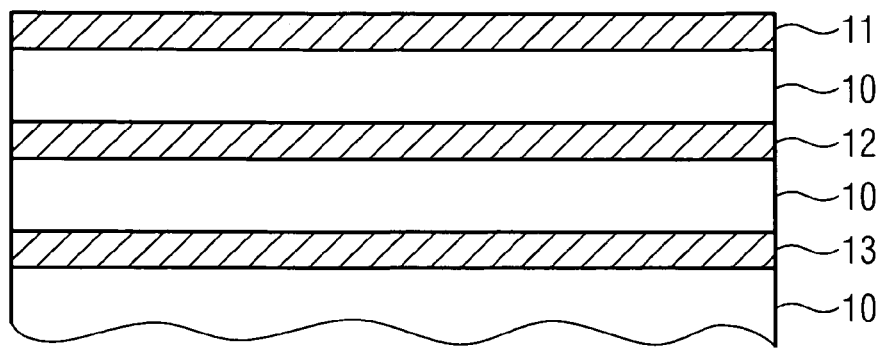
FIG. 2 shows a section through an inventive hearing apparatus chip.

FIG. 2 shows an inventive hearing apparatus chip in a sectional view. The substrate 10 has a metal layer 11 on its surface in the selected example, said metal layer being used as a signal wire for the integrated circuit. Insulated by the substrate 10, an additional metal layer 12 is positioned below the metal layer 11, it being possible to identify said metal layer 12 as the first earth wire and to use it as earth and/or functional earth of the integrated circuit. It is likewise used as a reference potential for the integrated circuit.

An additional, separate metal layer 13 is arranged below the metal layer 12. It is in turn galvanically separated from the metal layer 12 of the earth by means of the substrate 10. The additional metal layer 13 is used as an EMC earth. Currents, which are produced as a result of electromagnetic couplings, can be derived from the chip by way of the metal layer 13. If insufficient metal layers for a separate EMC earth are provided in the chip, an embedded, wide line can also be used instead.

Figure 3:
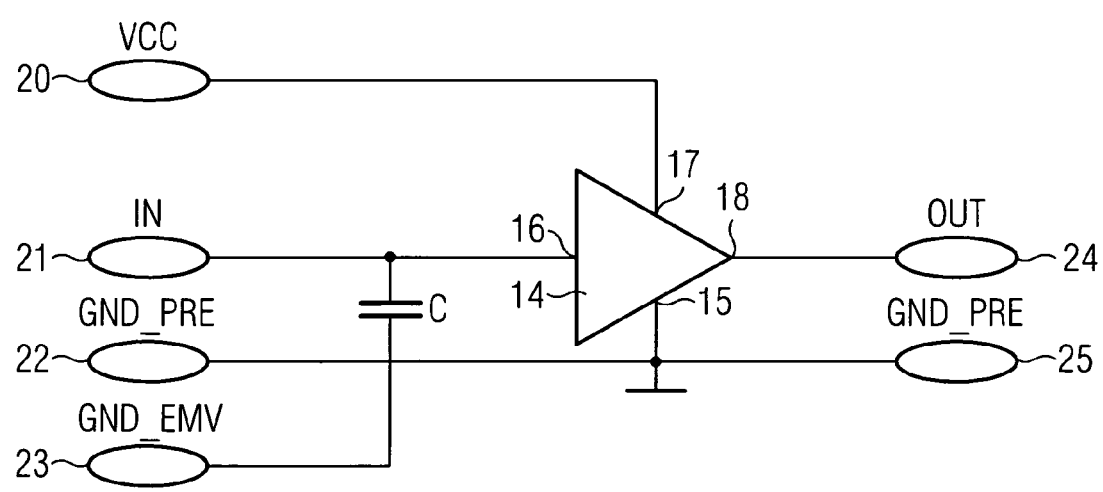
FIG. 3 shows a circuit diagram of an inventive amplifying chip.

FIG. 3 shows a hearing device chip as a simple amplifying circuit. It is used for instance as a preamplifier within a hearing device. The amplifier 14 used here has a first terminal 15, which is connected to earth. The earth here forms the metal layer 12 of the chip. For earth contacting purposes, a pin 22 (GND PRE) is provided on the chip on the input side. A corresponding pin 25 is located on the output side.

The amplifier 14 also has a second terminal 16, which is used as a signal input. This terminal is connected accordingly to an input pin 21. A further terminal 17 of the amplifier 14 is used for power supply purposes and is connected to a pin 20. The output signal of the amplifier 14 is provided on a further terminal 18 and is transmitted to an output pin 24. The structure corresponds to a conventional amplifying circuit.

A separate earth (GND EMC) is now provided here in accordance with the invention in order to conduct currents, which are produced by electromagnetic interferences, said earth (GND EMC) being realized in the substrate 10 as an intrinsic metal layer 13 or a line, as already described in conjunction with FIG. 2. It has an intrinsic connecting pin 23, by way of which it can be connected to the negative terminal of a battery by means of a connecting line. The EMC earth and/or the metal layer 13 is also applied to the input (input terminal 16) of the amplifier 14 by way of a capacitor C. High-frequency portions, which are contained in the input signal as interference, are however conducted to the EMC earth by way of the capacitor C. It is possible in this way for the particularly sensitive preamplifying earth not to be negatively affected by electromagnetic radiations and for the input signal of the amplifier 14 thus to be amplified in an interference-free fashion.

The EMC earth can also be guided into a specially provided layer of a conductor board in the hearing apparatus and/or hearing device for instance. In this case, the metal layer 13 of the chip is then connected to this conductor board layer and finally guided to the negative terminal of the battery.

In order to avoid interferences from electromagnetic irradiation, other components in the IC (integrated circuit) can also be connected to the corresponding substrate planes of the EMC ground (here the earth wire 13) in a low impedance fashion, i.e. by means of wide lines.

The invention claimed is:

1. A hearing apparatus chip for processing a signal of a hearing apparatus, comprising:
    an input pin connected to an input converter to receive microphone signals of a hearing apparatus;
    an output pin that outputs an amplified acoustic signal;
    a plurality of separate ground pins comprising a functional ground pin and an EMC ground pin;
    a signal-processing component embedded in the chip comprising an amplifier for receiving the microphone signals as an input signal from the input pin to produce the amplified acoustic output signal at the output pin, the amplifier having a first terminal connected to the functional ground pin via a first ground wire as a reference potential for the chip and a second terminal connected to the input pin for receiving the input signal; and
    a second ground wire embedded in the chip and insulated by a substrate and galvanically separated in the chip from the first ground wire and connected between the second terminal and the EMC ground pin by way of a capacitor in order to conduct high-frequency interference signals of the input signal as result of electromagnetic couplings to ground prior to being input into the amplifier.

2. The hearing apparatus chip as claimed in claim 1, wherein the second ground wire is a separate metal layer or at least as a separate partial layer.

3. The hearing apparatus chip as claimed in claim 1, wherein the second ground wire is a line embedded in the chip substrate.

4. The hearing apparatus chip as claimed in claim 1, wherein the second ground wire is a separate metal layer or at least as a separate partial layer insulated by the substrate.

5. The hearing apparatus chip as claimed in claim 1, wherein the second ground wire is a line embedded in the chip substrate insulated by the substrate.

6. The hearing apparatus chip as claimed in claim 1, wherein the first and second ground wire each have a separate connecting pin on the chip and are separately connected to a ground terminal of a current source.

7. A hearing apparatus, comprising:
    an input converter for receiving an acoustic signal microphone signals;
    an electrical voltage source; and
    a hearing apparatus chip for processing the microphone signals, comprising:
        an input pin that receives the microphone signals;
        an output pin that outputs an amplified acoustic signal;
        a plurality of separate ground pins comprising a functional ground pin and an EMC ground pin;
        a signal-processing component embedded in the chip comprising an amplifier for receiving the microphone signals as an input signal from the input pin to produce the amplified acoustic output signal at an output pin, the amplifier having a first terminal connected to the functional ground pin via a first ground wire as a reference potential for the chip and a second terminal connected to the input pin for receiving the input signal, and
        a second ground wire embedded in the chip and insulated by a substrate and galvanically separated on the chip from the first ground wire and connected between the second terminal and the EMC ground pin by way of a capacitor in order to conduct high-frequency interference signals of the input signal as result of electromagnetic couplings to ground prior to being input into the amplifier, wherein the first and second ground wires each connected to a ground terminal of the electrical voltage source by way of a connecting line in each instance through their respective separate ground pins and the two connecting lines only meeting directly at the ground terminal.

8. The hearing apparatus as claimed in claim 7, wherein the second ground wire is a separate metal layer or at least as a separate partial layer.

9. The hearing apparatus as claimed in claim 7, wherein the second ground wire is a line embedded in the chip substrate.

10. The hearing apparatus as claimed in claim 7, wherein the second ground wire is a separate metal layer or at least as a separate partial layer insulated by the substrate.

11. The hearing apparatus as claimed in claim 7, wherein the second ground wire is a line embedded in the chip substrate insulated by the substrate.

12. The hearing apparatus as claimed in claim 7, wherein the first and second ground wire each have a separate connecting pin on the chip and are separately connected to the ground terminal of the electrical voltage source.

* * * * *